(12) United States Patent
Fuller et al.

(10) Patent No.: US 9,343,345 B2
(45) Date of Patent: May 17, 2016

(54) REPLACEABLE WAFER SUPPORT BACKSTOP

(71) Applicant: ENTEGRIS, INC., Billerica, MA (US)

(72) Inventors: Matthew A. Fuller, Colorado Springs, CO (US); John Burns, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/398,957

(22) PCT Filed: May 6, 2013

(86) PCT No.: PCT/US2013/039763
§ 371 (c)(1),
(2) Date: Nov. 4, 2014

(87) PCT Pub. No.: WO2013/166512
PCT Pub. Date: Nov. 7, 2013

(65) Prior Publication Data
US 2015/0129459 A1    May 14, 2015

Related U.S. Application Data

(60) Provisional application No. 61/643,091, filed on May 4, 2012.

(51) Int. Cl.
*H01L 21/677*    (2006.01)
*H01L 21/673*    (2006.01)

(52) U.S. Cl.
CPC .... *H01L 21/67772* (2013.01); *H01L 21/67369* (2013.01); *H01L 21/67373* (2013.01); *H01L 21/67383* (2013.01); *Y10T 29/4973* (2015.01)

(58) Field of Classification Search
CPC .............. H01L 21/67369; H01L 21/67373; H01L 21/67383; H01L 21/67386; H01L 21/67772
USPC .............. 206/454, 710, 711; 211/41.18
See application file for complete search history.

(56) References Cited

U.S. PATENT DOCUMENTS

| | | | |
|---|---|---|---|
| 4,995,430 A | 2/1991 | Bonora et al. | |
| 5,785,186 A * | 7/1998 | Babbs ............... | H01L 21/67294 206/454 |
| 6,267,245 B1 | 7/2001 | Bores et al. | |
| 7,168,587 B2 | 1/2007 | Eggum | |
| 7,182,203 B2 | 2/2007 | Burns et al. | |
| 7,344,031 B2 | 3/2008 | Hasegawa et al. | |

(Continued)

FOREIGN PATENT DOCUMENTS

| | | | |
|---|---|---|---|
| JP | 2006-332261 A | 12/2006 | |
| JP | 4372313 B2 | 9/2009 | |

(Continued)

*Primary Examiner* — Bryon Gehman
(74) *Attorney, Agent, or Firm* — Christensen Fonder P.A.

(57) ABSTRACT

A wafer container an enclosure portion including a top wall, a bottom wall, a pair of side walls, a back wall, and a door frame opposite the back wall, the door frame defining a front opening, and a wafer support structure including two side wafer supports 5 each side wafer support including a removable backstop. The invention includes maintaining wafer containers by replacing the removable backstop. The invention includes converting shipping containers that ship large diameter wafers vertically to containers to be used in fabrication facilities that store wafers horizontally for robotic pickup for processing.

12 Claims, 9 Drawing Sheets

(56) References Cited

U.S. PATENT DOCUMENTS

| | | | | |
|---|---|---|---|---|
| 7,828,341 B2 * | 11/2010 | Hasegawa | ......... | H01L 21/67373 206/711 |
| 8,047,379 B2 * | 11/2011 | Chiu | ................. | H01L 21/67383 206/710 |
| 8,387,799 B2 * | 3/2013 | Chiu | ................. | H01L 21/67383 206/710 |
| 8,464,872 B2 * | 6/2013 | Inoue | ................ | H01L 21/67383 206/454 |
| 8,910,792 B2 * | 12/2014 | Nagashima | ....... | H01L 21/67369 206/454 |
| 8,919,563 B2 * | 12/2014 | Gregerson | ........ | H01L 21/67383 206/710 |
| 2006/0283774 A1 | 12/2006 | Hasegawa et al. | | |
| 2010/0258475 A1 | 10/2010 | Ogawa | | |
| 2011/0005967 A1 * | 1/2011 | Gregerson | ........ | H01L 21/67383 206/711 |

FOREIGN PATENT DOCUMENTS

| | | |
|---|---|---|
| JP | 2010-182948 A | 8/2010 |
| WO | WO 2012/054644 A2 | 4/2012 |

\* cited by examiner

REPLACEABLE WAFER SUPPORT BACKSTOP

RELATED APPLICATIONS

This present application is a National Phase entry of PCT Application No. PCT/US2013/039763, filed May 6, 2013, which claims priority to U.S. Provisional Application No. 61/643,091, filed May 4, 2012, the disclosures of which are incorporated by reference in their entirety.

FIELD OF THE INVENTION

This invention relates to containers for sensitive substrates such as semiconductor wafers and in particular to the wafer supporting structures of such containers.

BACKGROUND OF THE INVENTION

Integrated circuits such as computer chips are manufactured from semiconductor wafers. These wafers are subjected to numerous steps during the process of making integrated circuits. This generally entails transporting a plurality of wafers from one workstation to another for processing by specialized equipment. As part of the processing procedure, wafers may be temporarily stored or shipped in containers to other plants or to end users. Such intra-facility and extra-facility movements may generate or expose the wafers to potential wafer ruining contaminants. In order to reduce the deleterious effect of contaminants on wafers, specialized containers have been developed to minimize the generation of contaminants and to isolate wafers from contaminants exterior to the containers. A principal feature common to these containers is that they are provided with supporting structures to support the wafers inside.

Plastic containers have been used for decades for transporting and storing wafers in-between process steps. Such containers have highly controlled tolerances for interfacing with processing equipment as well as the equipment/robots that transport the containers. Moreover, it is desirable in such plastic containers to use components that are attachable and removable without using metallic fasteners such as screws, since metal fasteners can cause particle generation when inserted and removed.

Additional, required or desirable characteristics of containers to transport and/or store semiconductor wafers include light weight, rigidity, cleanliness, limited gaseous emissions, and cost effective manufacturability. The containers provide hermetic or close to hermetic isolation of wafers when the containers are closed. Simply stated, such containers need to keep the wafers clean, uncontaminated, and undamaged. Additionally, carriers need to maintain their capabilities under the rigors of robotic handling which includes lifting the carrier by the robotic flange positioned at the top of the container. Further, carriers may be subject to shock from any direction when in transit as well as being subject to changes in orientation when in transit.

Front opening wafer containers have become the industry standard for transporting and storing large diameter 300 mm wafers. In such, containers the front door is latchable within a door frame of a container portion, and closes a front access opening through which the wafers are robotically inserted and removed. When the container is fully loaded with wafers the door is inserted into the door frame of the container portion and latched thereto. The enclosure portion generally includes a top wall, a bottom wall, side walls, a back wall, and a door frame defining a front opening.

The semiconductor industry is now moving toward using even larger 450 mm diameter wafers. The larger diameter wafers, although providing cost efficiencies, also provide increased fragility, greater weight, and present undiscovered issues associated with handling and storing the larger wafers in containers made of plastic. Deflection and related problems associated with the expanses of plastic on the top, bottom, sides, front, and back are exacerbated. When the carrier door seats and engages the receiving frame of the carrier shell, the door cushion pushes the wafer against a rigid surface or backstop that is located near the rear of the carrier shell. In a carrier, such as a FOUP, used for the transport of wafers in a FAB facility, one of the reasons for alignment with the backstop is to accurately position the wafer radially. This raises several concerns. First, in cases where the wafer retention forces applied by the door cushion are large, contact stresses between the wafer and the backstop can permanently deform the backstop surface. Second, over time, the wafer backstop will wear due to contact with the wafer during carrier transport. The wear can occur due to ordinary transport operation or under conditions of excessive transport vibration. Third, to minimize the above two problems, it may be required for the backstop to be manufactured from a different material than the wafer support. Although a design for a replaceable backstop exists wherein a backstop component is attached to the rear interior wall of the carrier shell, this arrangement tends to cause the wafer position to be inaccurate due to the location of the wafer backstop contact surfaces relative to the center axis of the wafer.

A wafer carrier used for shipping wafers, such as a FOSB or MAC generally includes wafer supports that lift the wafers during wafer shipment. If the wafer shipping carrier is then repurposed for use in a FAB, it is no longer desirable for the wafer to be stored in a lifted position.

There are several drawbacks associated with prior wafer handling devices or containers related to these issues. In one prior art approach, the wafer backstop is integrated into wafer support. Therefore, the backstop is made from the same material as the wafer support. The wafer support is comprised of a low wear, rigid material. Although the wafer support is designed to endure the contact stresses generated by the retention of the wafer, the backstop will wear over time due to forces normally generated during transport.

In another prior art approach, the wafer backstop is overmolded onto the wafer support and is a different material than the wafer support. The overmolded material has high wear resistance and is rigid. Here, although the wafer support backstop is designed to endure the contact stresses generated by the retention of the wafer, the backstop will still wear over time due to forces typically generated during transport.

Accordingly, a need in the industry exists for a wafer container that addresses one or more of these problems, particularly as they exist relative to containers for 450 mm diameter and larger wafers.

SUMMARY OF THE INVENTION

Embodiments of the invention address the need of the industry for a wafer container that reduces or alleviates one or more of the problems associated with excessive container wall wear and deformation induces by transport of wafer containers, particularly as those problems are experienced with containers for 450 mm diameter and larger wafers.

A wafer container an enclosure portion including a top wall, a bottom wall, a pair of side walls, a back wall, and a door frame opposite the back wall, the door frame defining a front opening, and a wafer support structure including two side wafer supports 5 each side wafer support including a removable backstop. The invention includes maintaining wafer containers by replacing the removable backstop. The invention includes converting shipping containers that ship large diameter wafers vertically to containers to be used in fabrication facilities that store wafers horizontally for robotic pickup for processing.

In an embodiment, a front opening wafer container suitable for large diameter wafers uses a wafer backstop that is replaceable and that is formed from a material that has a different modulus than the material that the wafer support shell is formed from. The wafer backstop is formed of a material that has greater wear resistance than the material of the wafer support. The backstop of the present invention is replaceable and includes snap fit style spring members that facilitate removal, replacement and assembly of the backstop within the wafer container shell.

In embodiments of the invention the removable backstops engage the wafers at a position about 40 degrees to about 50 degrees each of left and right of rear center. A feature and advantage is that this is an ideal position for centering the wafer for robotic retrieval.

According to one embodiment of the invention, a carrier configured for shipping wafers can be configured for transport and storage within a FAB, for example by adding the backstop to each of the side wafer supports. In embodiments, the configuring can also include removal of wafer cushions within the container intended just for shipping; for example, removable cushions at the rear of the container portion, removable cushions at the left front and right front regions forward of the left and right side wafer supports.

An advantage and feature of the invention is that a worn backstop can easily be replaced in the field.

An advantage and feature of the invention is decreased operational costs because the backstop is replaceable. Instead of replacing an entire wafer support or carrier, only the backstop need be replaced. Currently the replacing of an entire wafer support due to the wear of an integrated backstop requires that the wafer plane associated with the carrier needs to be reaffirmed.

Another advantage of the invention is that the radial position of the wafer can be moved to a new position by replacing the wafer backstop according to the present invention.

An advantage and feature of embodiments of the invention, especially for a 450 mm case, is that compared to a centrally located replaceable rear backstop, the position of the backstop of the invention located on the wafer support leads to more precise wafer position in the radial direction. Assuming equivalent assembly tolerances, geometric relationships dictate that while rear backstop placement leads to precise wafer position in the y-direction (front to back), it leads to less precise wafer position in x-direction (left to right). The position of the wafer support backstop according to the invention is optimal due to its position balanced between the rear and the side of the carrier.

An advantage and feature of embodiments of the invention is that a wafer backstop of a wafer support permanently deforms when wafer retention forces are applied. If the wafer backstop is replaceable then it can also be manufactured using a different material than the wafer support. For example, if the wafer support is comprised of a low modulus material, the replaceable backstop can be formed of a higher modulus material that also has a higher yield strength.

A feature and advantage of embodiments of the invention is that the wafer contact surfaces of the backstop are in close proximity to a plurality of positioning stop surfaces and locking members to provide repeatability in wafer positioning when the backstop is replaced. The close proximity minimizes errors such as due to molding deviations or slight misalignments. In an embodiment the wafer contact surfaces are within 1.5 cm of a positioning stop surface. In embodiments within 1 cm. In embodiments, within 2 cm.

A feature and advantage of embodiments is that the positioning of the backstop is off of the smaller component, the wafer supports, rather than the prior art alternative, the larger expansive less precise shell portion. The side wafer supports are already required to be precisely positioned to a high degree of accuracy due to the robotic wafer pick up requirements. The back side of the shell, where the prior art wafer stops may be located, do not have the precise positioning requirements and the existence of the vast expanses of polymer in the walls make positioning the stops off of same less precise.

Assuming contact stress associated with the applied wafer retention is less than the yield strength of the material, permanent deformation will not occur in the backstop of the invention.

BRIEF DESCRIPTION OF THE DRAWINGS

The embodiments of the present invention may be more completely understood in consideration of the following detailed description of various embodiments in connection with the accompanying drawings, in which.

Figure 1:
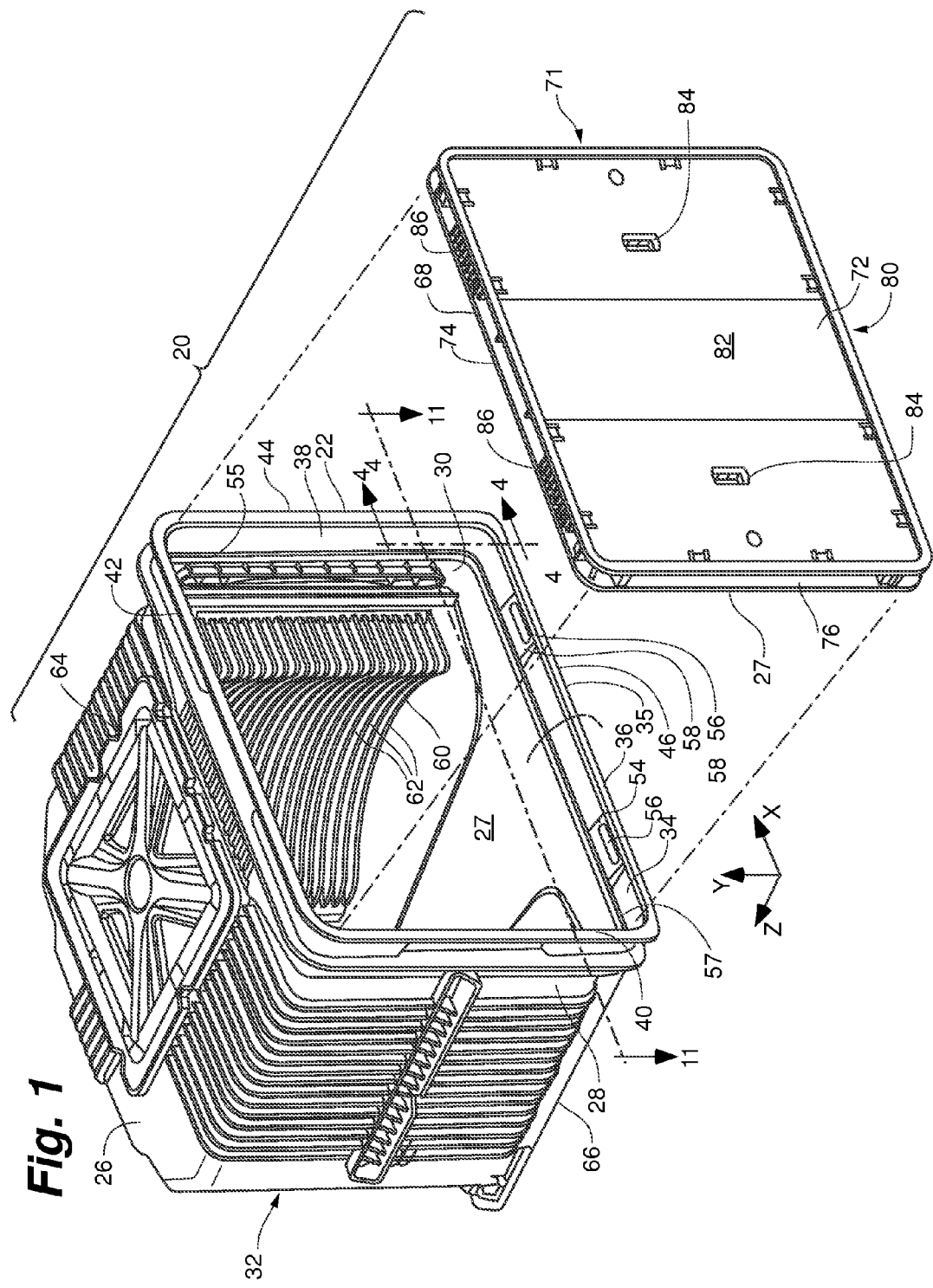
FIG. 1 is an exploded front isometric view of a front-opening wafer container according to an embodiment of the invention.
Figure 2:
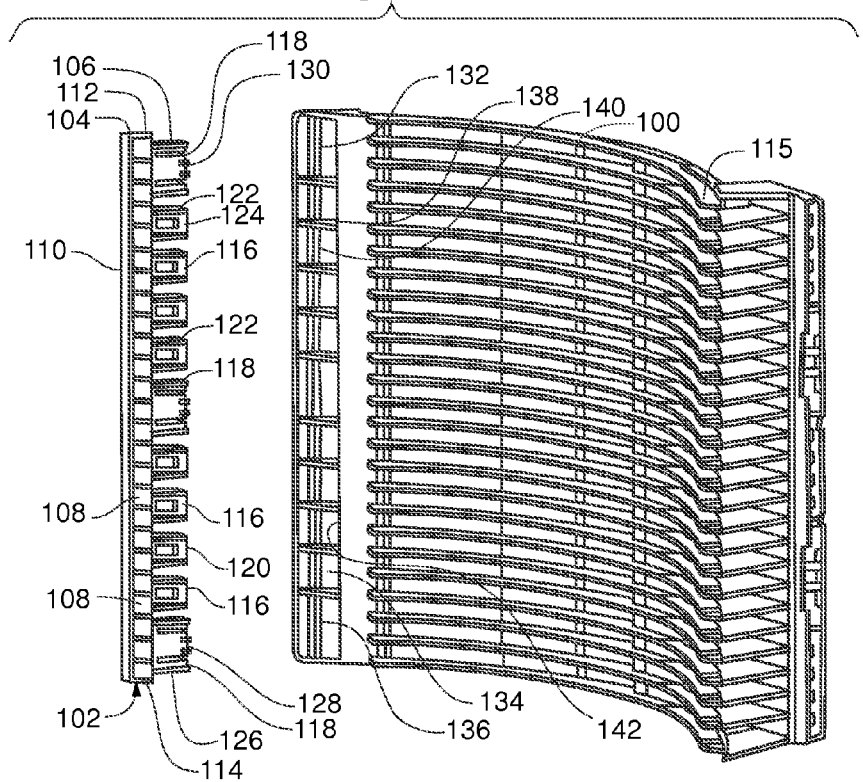
FIG. 2 is an exploded isometric view of an embodiment of a wafer support assembly for the container of FIG. 1.
Figure 3:
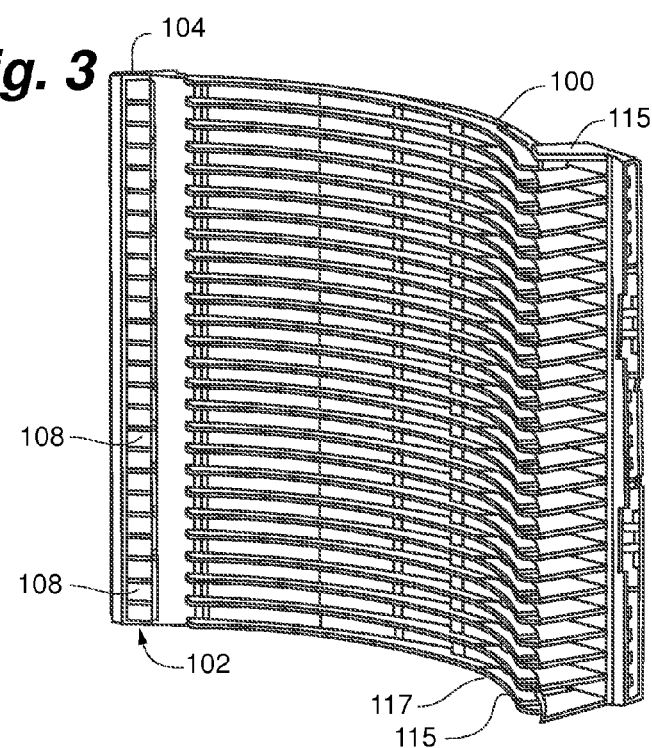
FIG. 3 is an assembled isometric view of an embodiment of a wafer support assembly of FIG. 2 for the container of FIG. 1.
Figure 4:
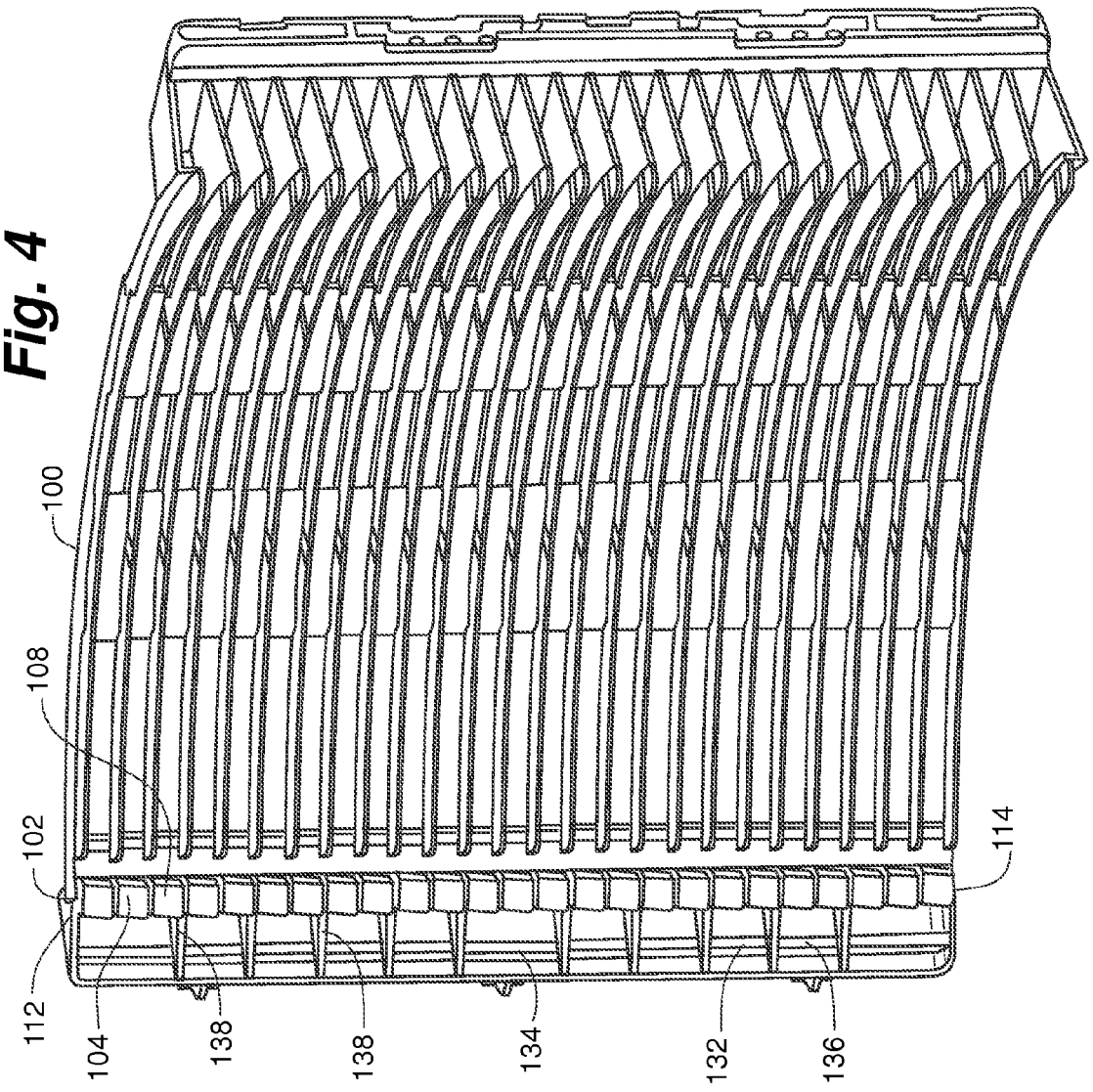
FIG. 4 is an assembled isometric view of an embodiment of a wafer support assembly of FIG. 2 for the container of FIG. 1 according to another embodiment of the invention.
Figure 5:
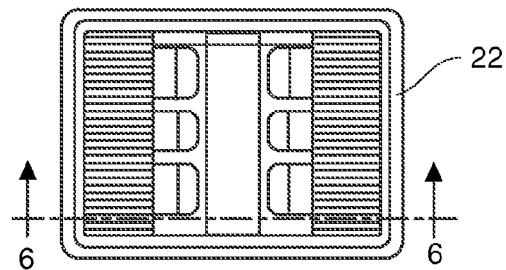
FIG. 5 is a front elevational view of a wafer container according to an embodiment of the invention.
Figure 6:
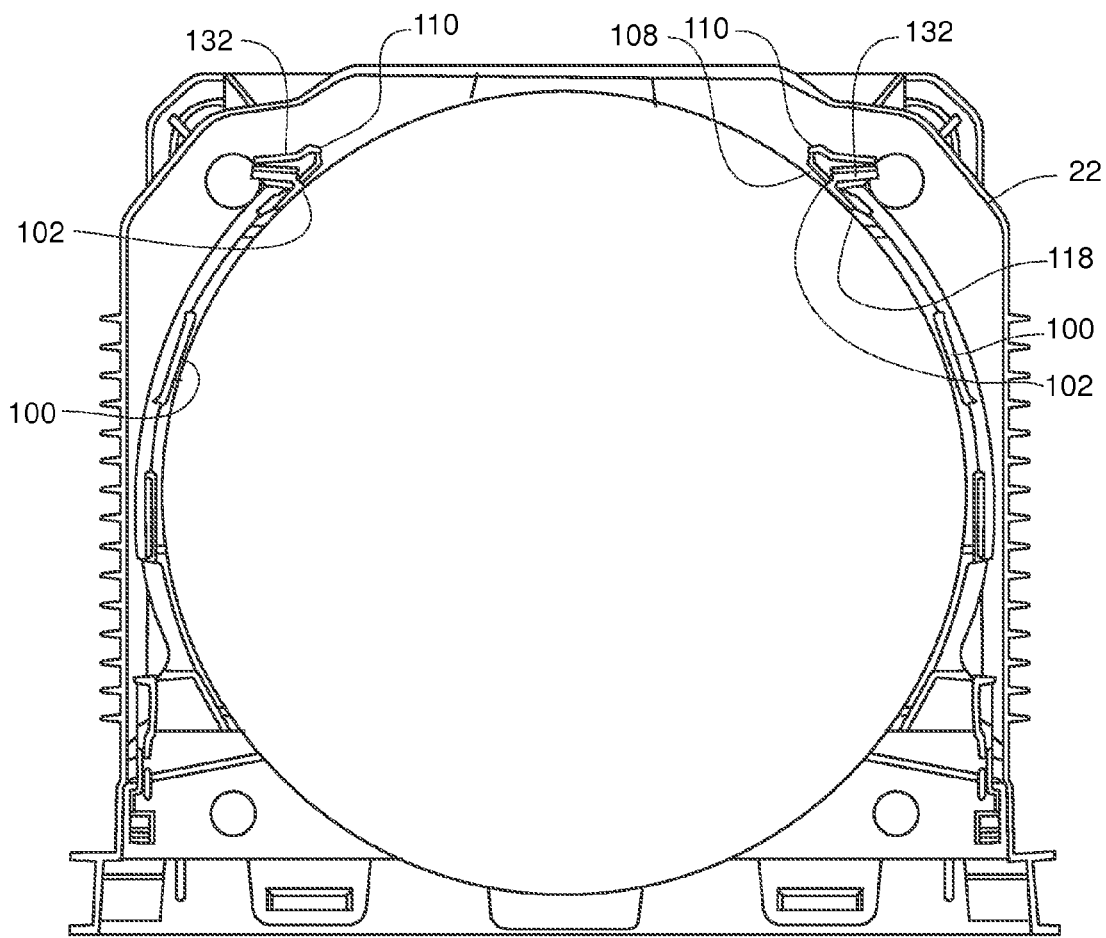
FIG. 6 is cross sectional view of the wafer container of FIG. 5 taken on section line 6-6 of FIG. 5.
Figure 7:
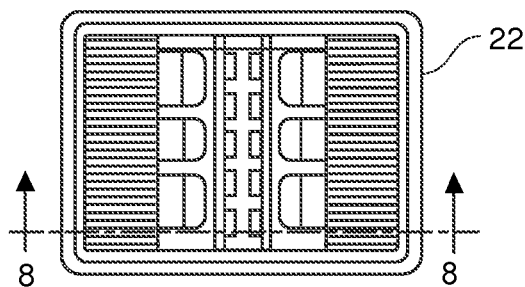
FIG. 7 is a front elevational view of a wafer container according to an embodiment of the invention.
Figure 8:
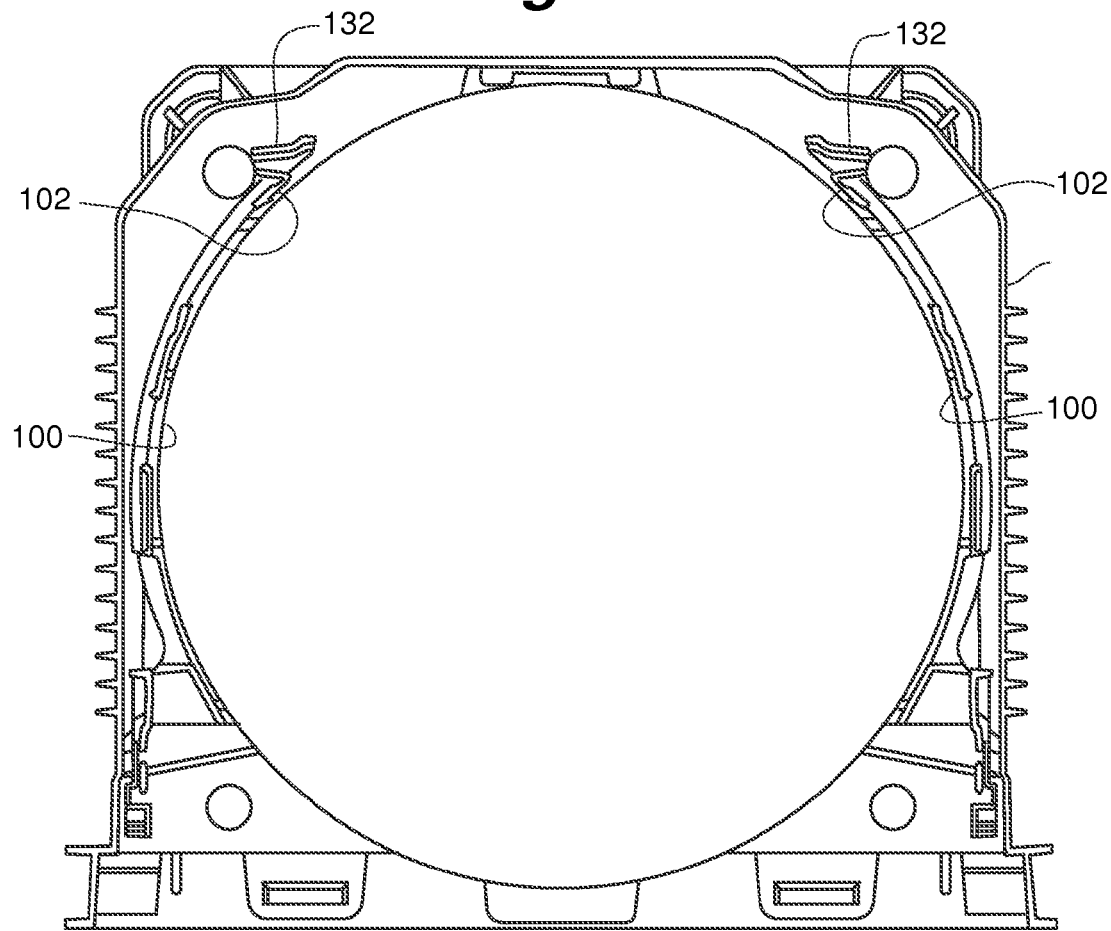
FIG. 8 is a cross-sectional view taken on section line 8-8 of FIG. 7.
Figure 9:
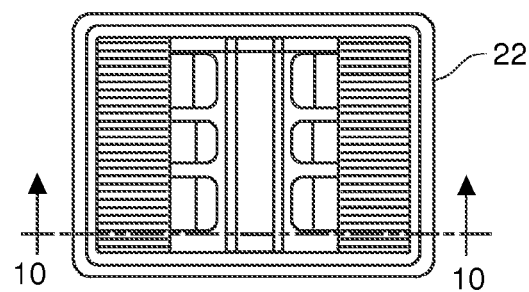
FIG. 9 is a front elevational view of a wafer container according to an embodiment of the invention.
Figure 10:
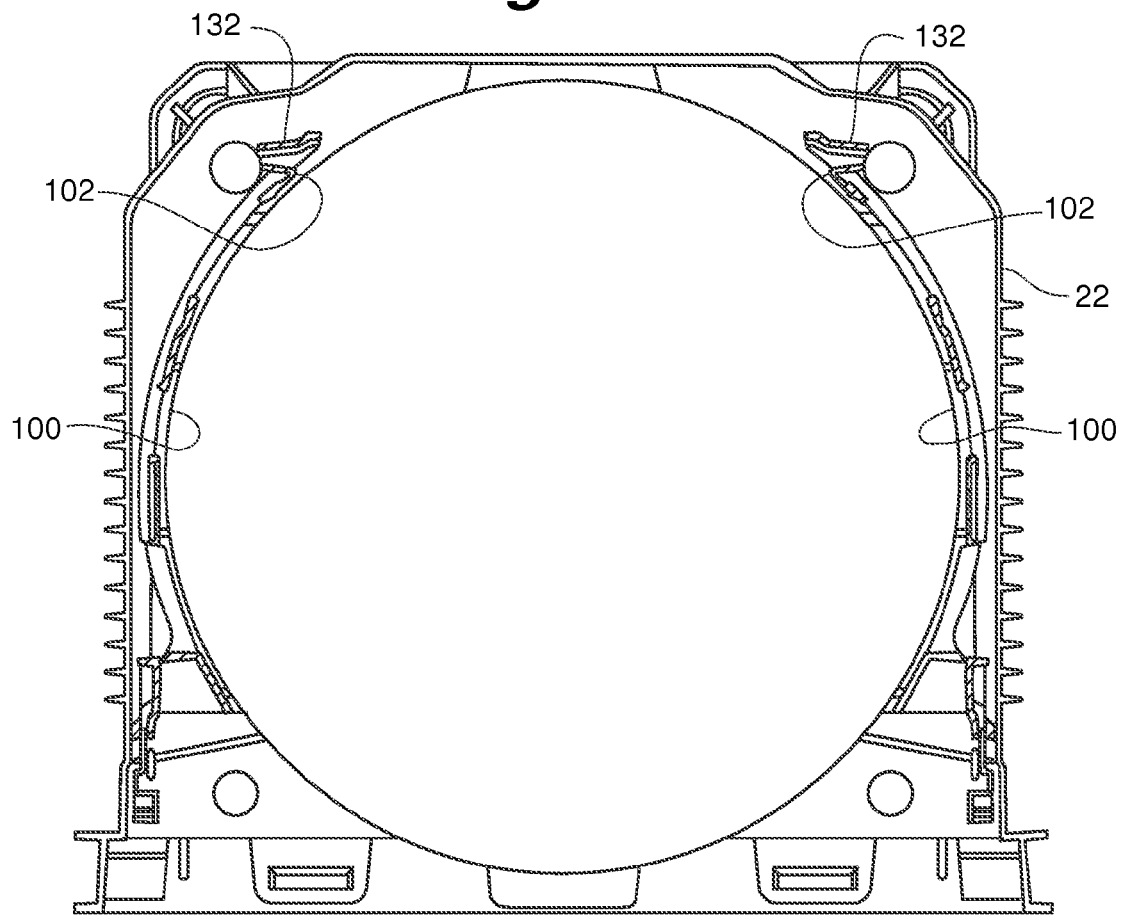
FIG. 10 is a cross-sectional view taken on section line 10-10 of FIG. 9.
Figure 11:
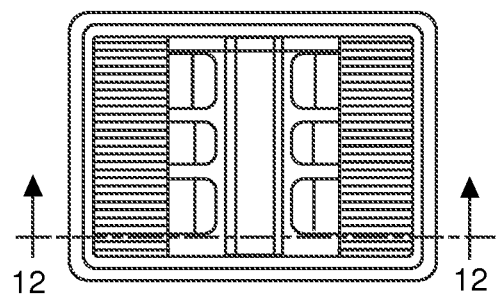
FIG. 11 is a front elevational view of a wafer container according to an embodiment of the invention.
Figure 12:
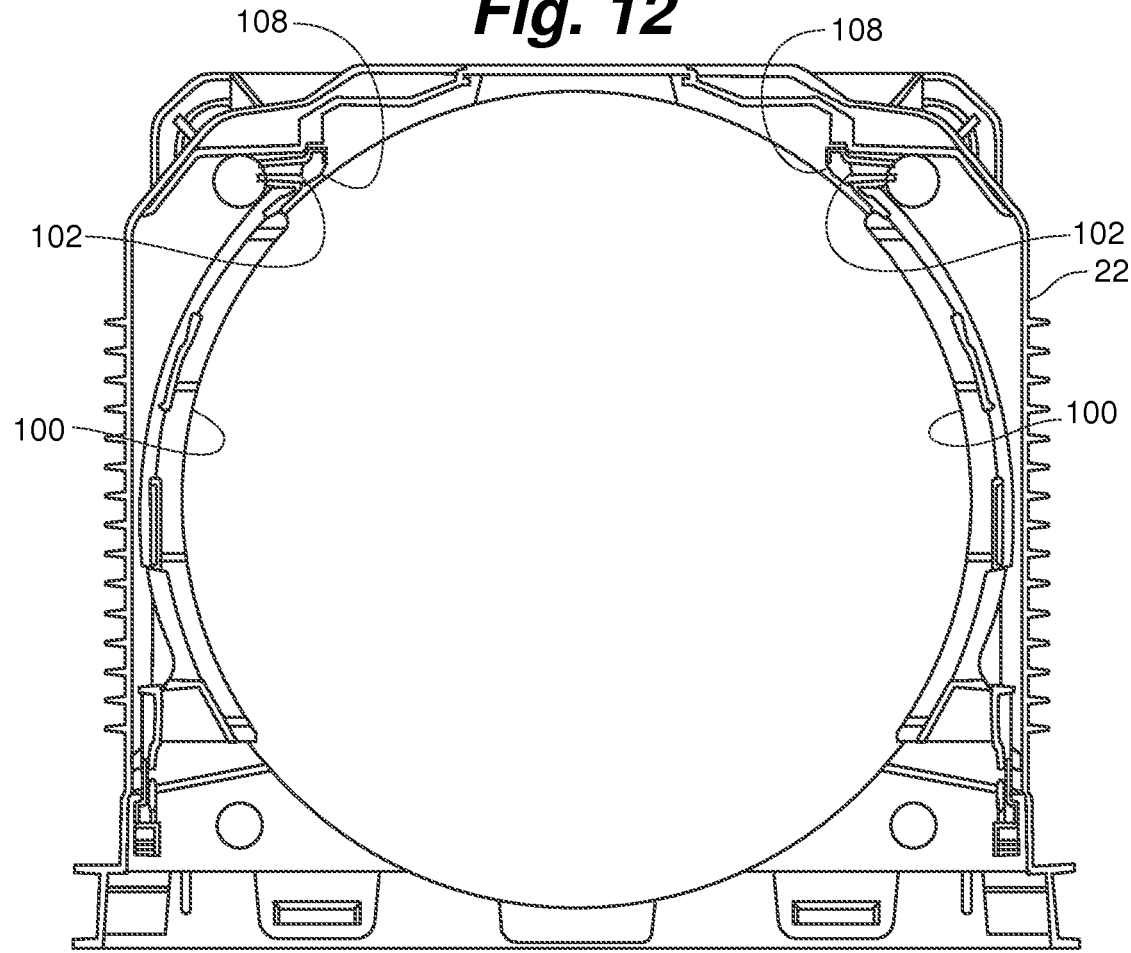
FIG. 12 is a cross-sectional view taken on section line 12-12 of FIG. 11.

While the present invention is amenable to various modifications and alternative forms, specifics thereof have been shown by way of example in the drawings and will be described in detail. It should be understood, however, that the intention is not to limit the present invention to the particular embodiments described. On the contrary, the intention is to cover all modifications, equivalents, and alternatives falling within the spirit and scope of the present invention.

DETAILED DESCRIPTION

For purposes of this application, relative direction may be described in terms of "x" and "y" and "z" directions and these designations relative to the parts of the container are intended to be in accordance with the directional key provided as a part of FIG. 1.

Referring now to FIG. 1, a front opening wafer container 20 generally includes an enclosure portion 22 and a front door 24. Enclosure portion 22 generally includes top wall 26, bottom wall 27, side walls 28, 30, back wall 32, and door frame 34 defining a front opening 36. In addition, latch bolt recesses 56 are defined in each of top side 42 and bottom side 46 of door frame 34. Each latch bolt recess 56 is surrounded by raised portion 58. Outwardly facing interlock groove 55 is defined at inner edge 57 of door frame 34. Wafer support structure 60 may be provided inside enclosure portion 22 for receiving wafers in a plurality of slots 62. A robotic lifting flange 64 and a kinematic coupling 66 as are known in the art may be provided on the top and bottom outer surfaces respectively of enclosure portion 22.

Front door 24 generally includes body portion 68 presenting rear side 70, front side 72, top peripheral face 74, side peripheral faces 76, 78, and bottom peripheral face 80. A pair of latch recesses (not depicted) are defined in front side 72, and are covered by front panel 82. Each latch recess receives a latching mechanism (not depicted), operable by a key insertable though key apertures 84 in front panel 82 to selectively extend and retract latch bolts 86 to engage in latch bolt recesses 56 of container portion 22 to secure front door 24 in door frame 34. The latch mechanisms can be generally configured as disclosed in U.S. Pat. Nos. 4,995,430; 7,182,203; or 7,168,587, all of which are owned by the owner of the instant application, and all of which are hereby incorporated herein by reference.

Referring to FIGS. 2, 3, 4, 14 and 15, wafer support structure 60 generally includes two side wafer supports 100 that are generally mirror images of each other. According to the invention, side wafer support 100 has an associated removable backstop 102.

Removable backstop 102 includes wafer engagement portion 104 and an attachment or coupling portion 106. Wafer engagement portion includes vertically aligned wafer engagement surfaces 108, longitudinal rearward edge 110, top edge 112 and bottom terminus 114. Each of the wafer engagement surfaces 108 is aligned with a respective slot 62 and the top surface 115 of a respective wafer shelf 117.

Coupling portions 106 generally includes alignment members 116 and snap members 118 all configured as horizontally extending tabs. Alignment members 116 may present opening 120 and peripheral ridges 122 extending from body 124. Snap members 118 may include edge portions 126 and central flex member 128. Central flex member 128 may present spring or snap catches 130 extending outwardly therefrom that are configured as hook portions 131.

Wafer support structure 60 presents receiving or cooperating attachment portions 132 which are configured as slots 133 to receive coupling portion 106, configures as tabs, in a complementary fashion. Coupling receiving portion 132 presents alignment member receivers 134 and spring member engagement portion 136 and catch surface 137. Coupling member 132 has a stop surface 139 that stops the wafer engagement portion of the backstop in approximate radial alignment with the wafer engagement surface 108.

Alignment member receivers 134 and snap member receivers 136, both defining slots, are separated by intermediate walls 138 backed by back walls 140 and bordered by front walls 142.

Referring to FIGS. 6, 8, 10 and 12, side wafer support 100 and removable backstops 102 are depicted in sectional view as situated in enclosure portion 22.

Figure 13:
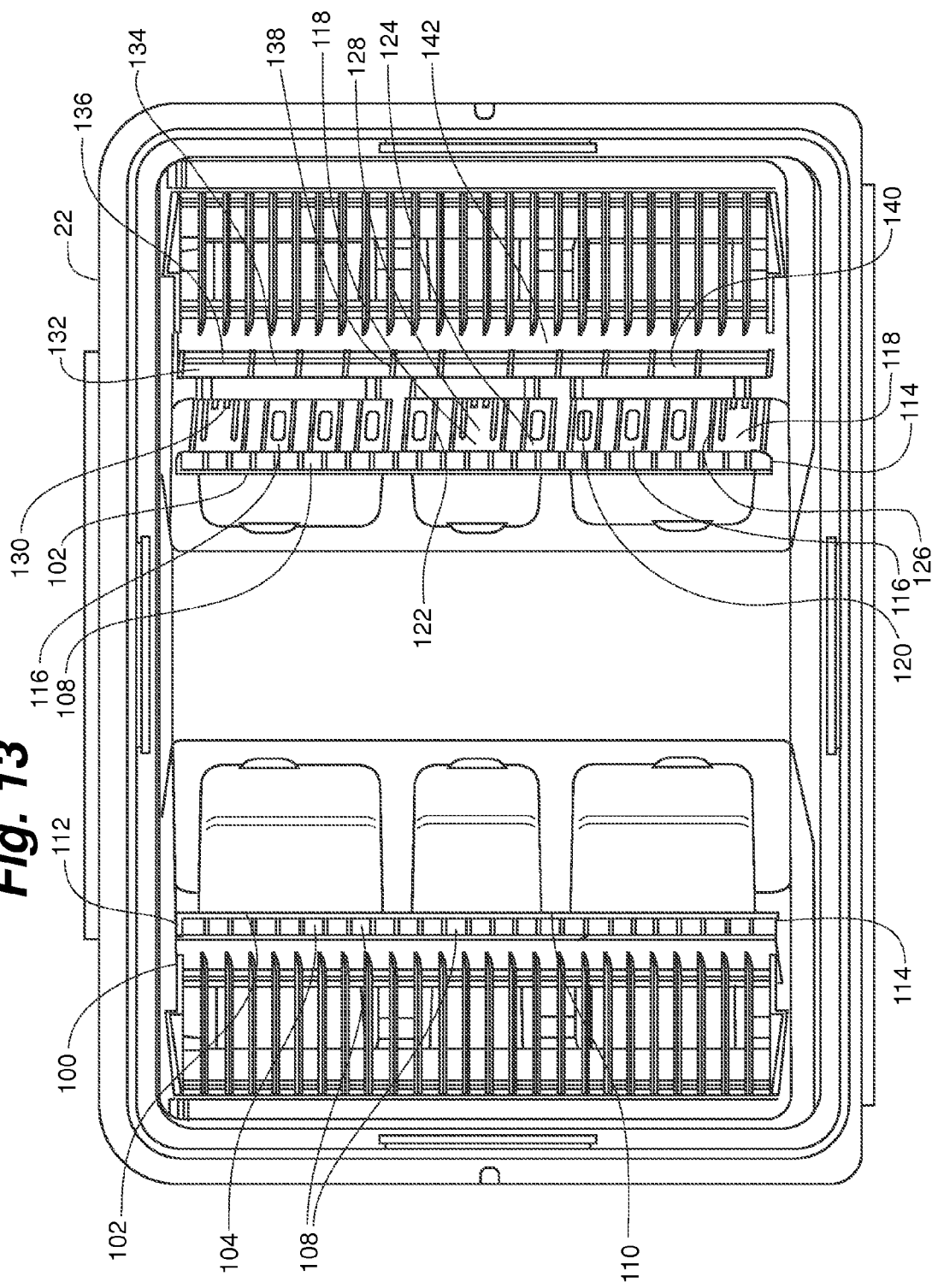
FIG. 13 is a front elevational view of a wafer container according to an embodiment of the invention.
Figure 14:
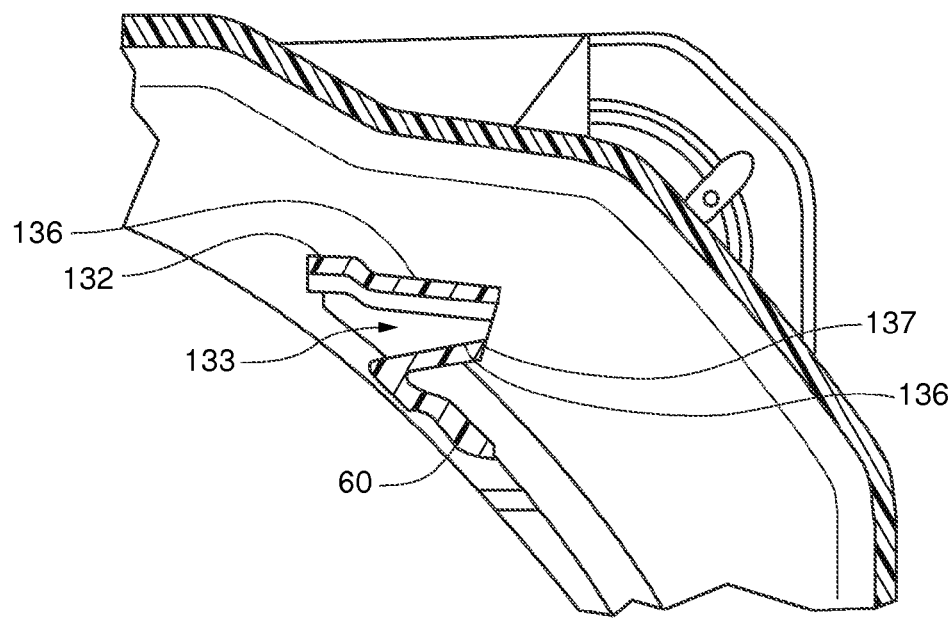
FIG. 14 is a cross sectional detailed view of a cooperating attachment portion of a side wafer support, specifically a slot for receiving a tab.
Figure 15:
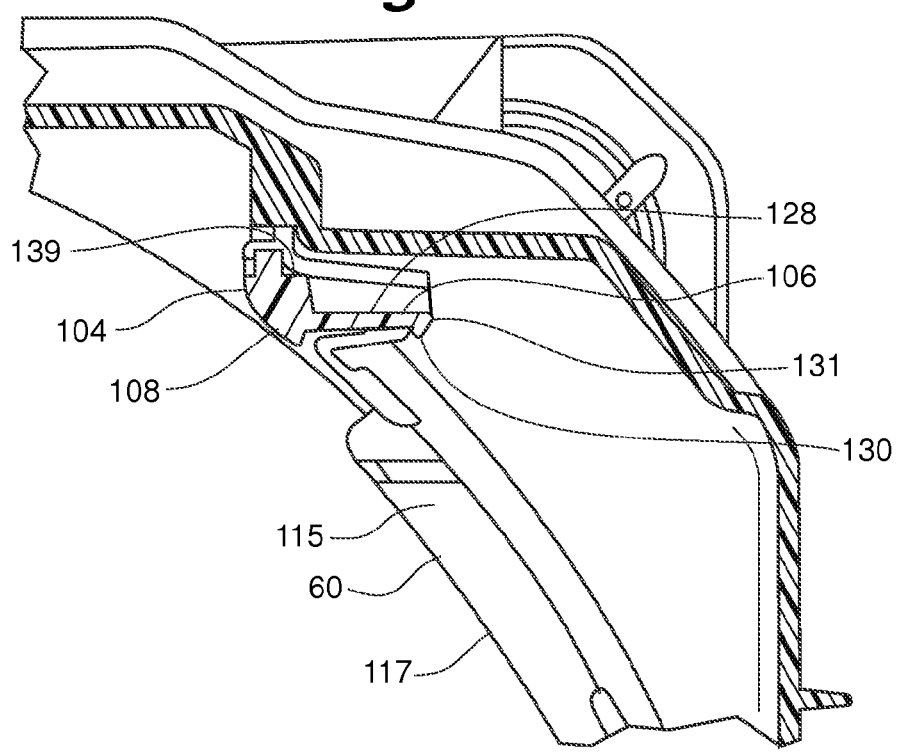
FIG. 15 is the cross sectional view of FIG. 14 with a backstop with a spring catch attached to the side wafer support.

Referring to FIG. 13 side wafer support 100 and removable backstops 102 are depicted in an unassembled or unattached position and an assembled or attached position.

In operation, alignment members 116 and snap or spring members 118 are inserted into alignment member receivers 134 and snap or spring member receivers 136 respectively. Wafer support ramps are then aligned with slots 62 and wafers inserted into slots 62 are then supported to resist movement in both the x and y directions. Thus, wafers are protected against shock that may occur in transit as well as accurately positioned radially. If wafer support portion 104 shows wear after a time, removable backstop 102 can easily be removed by pulling it from side wafer support 100, by releasing spring or snap members and replaced with a new removable backstop 102 even in the field. PCT/US2011/056944 describes wafer containers with many general features of the present invention and this reference is hereby incorporated by reference herein in its entirety.

The foregoing descriptions and the appendices present numerous specific details that provide a thorough understanding of various embodiments of the invention. It will be apparent to one skilled in the art that various embodiments, having been disclosed herein, may be practiced without some or all of these specific details. In other instances, components as are known to those of ordinary skill in the art have not been described in detail herein in order to avoid unnecessarily obscuring the present invention. It is to be understood that even though numerous characteristics and advantages of various embodiments are set forth in the foregoing description, together with details of the structure and function of various embodiments, this disclosure is illustrative only. Other embodiments may be constructed that nevertheless employ the principles and spirit of the present invention. Accordingly, this application is intended to cover any adaptations or variations of the invention.

For purposes of interpreting the claims for the present invention, it is expressly intended that the provisions of Section 112, sixth paragraph of 35 U.S.C. are not to be invoked unless the specific terms "means for" or "step for" are recited in a claim.

The above references in all sections of this application are herein incorporated by references in their entirety for all purposes.

All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment (s). The invention extends to any novel one, or any novel combination, of the features disclosed in this specification (including any incorporated by reference references, any accompanying claims, abstract and drawings), or to any novel one, or any novel combination, of the steps of any method or process so disclosed The above references in all sections of this application are herein incorporated by references in their entirety for all purposes.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

What is claimed is:

1. A front opening container for large diameter semiconductor wafers comprising:
    an enclosure portion including a top wall, a bottom wall with a kinematic coupling disposed thereon, a left side wall and a right side wall, a back wall, and a door frame opposite the back wall, the door frame defining a front opening, and
    wafer support structure including two side wafer supports, each side wafer support comprising a plurality of spaced vertically aligned wafer shelves, one side wafer support positioned at the left side wall and one positioned at the right side wall, each side wafer support having rearwardly positioned attachment structure for receiving a backstop;
    a pair of wafer backstops each having cooperating attachment structure for attachment to the rearwardly positioned attachment structure of each of the wafer support structures, each wafer backstop having a plurality of vertically aligned wafer engagement surfaces corresponding to each of the plurality of wafer shelves;
    wherein one of the pair of wafer backstops and the two side wafer supports has a plurality of horizontally extending tabs and the other has a plurality of horizontally extending slots configured to receive the tabs.

2. The front opening container for large diameter semiconductor wafers of claim 1 wherein the plurality of horizontally extending tabs includes a plurality of spring catches to releasably lock the pair of backstops to the two side wafer supports.

3. The front opening container for large diameter semiconductor wafers of claim 1 in combination with a plurality of 450 mm wafers seated on the plurality of wafer shelves.

4. A front opening container for large diameter semiconductor wafers comprising:
    an enclosure portion including a top wall, a bottom wall with a kinematic coupling disposed thereon, a left side wall and a right side wall, a back wall, and a door frame opposite the back wall, the door frame defining a front opening, and
    wafer support structure including two side wafer supports, each side wafer support comprising a plurality of spaced vertically aligned wafer shelves, one side wafer support positioned at the left side wall and one positioned at the right side wall, each side wafer support having rearwardly positioned attachment structure for receiving a backstop;
    a pair of wafer backstops each having cooperating attachment structure for attachment to the rearwardly positioned attachment structure of each of the wafer support structures, each wafer backstop having a plurality of vertically aligned wafer engagement surfaces corresponding to each of the plurality of wafer shelves,
    wherein each of the plurality of vertically aligned wafer engagement surfaces is positioned at an angle measured from an axial center of wafers seated in the enclosure portion of 40 to 50 degrees from a vertical plane extending directly rearwardly from said axial center.

5. A front opening container for large diameter semiconductor wafers comprising:
    an enclosure portion including a top wall, a bottom wall with a kinematic coupling disposed thereon, a left side wall and a right side wall, a back wall, and a door frame opposite the back wall, the door frame defining a front opening, and
    wafer support structure including two side wafer supports, each side wafer support comprising a plurality of spaced vertically aligned wafer shelves, one side wafer support positioned at the left side wall and one positioned at the right side wall, each side wafer support having rearwardly positioned attachment structure for receiving a backstop;
    a pair of wafer backstops each having cooperating attachment structure for attachment to the rearwardly positioned attachment structure of each of the wafer support structures, each wafer backstop having a plurality of vertically aligned wafer engagement surfaces corresponding to each of the plurality of wafer shelves,
    wherein the pair of wafer backstops each have a plurality of upright wafer engagement surfaces aligned with and transverse to a plurality of top surfaces of the plurality of shelves and the wafer engagement surfaces are positioned to center the wafers on the plurality of wafer shelves for robotic pickup.

6. The front opening container for large diameter semiconductor wafers of claim 5 wherein each of the pair of wafer backstops engage the respective wafer support at a plurality of vertically aligned stop surfaces of the wafer support that are each in substantial radial alignment with a respective wafer engagement surface of the respective wafer backstop.

7. A front opening container for containing a plurality of large diameter semiconductor wafers, the container comprising:
    an enclosure portion having an open interior and comprising a top wall adapted to receive a robotic flange, a bottom wall with a kinematic coupling disposed thereon, a left side wall and a right side wall, a back wall, a door frame opposite the back wall, the door frame defining a front opening, and
    two side wafer supports positioned in the enclosure portion, one associated with the left side wall and one associated with the right side wall; each side wafer support comprising a plurality of spaced vertically aligned wafer shelves defining slots for the large diameter semiconductor wafers, each side wafer support having a forward portion and a rearward portion;
    a pair of wafer backstops removably attached to the rearward end of each of the two side wafer supports, each wafer backstop having a plurality of vertically aligned wafer engagement surfaces corresponding to each of the plurality of wafer shelves and defining the backside of the wafer slots: and a door with a latch mechanism, configured to sealingly close the front opening, the door comprising a wafer cushion for engaging the plurality of large diameter wafers;

wherein one of the pair of wafer backstops and the two side wafer supports has a plurality of horizontally extending tabs and the other has a plurality of horizontally extending slots configured to receive the tabs.

8. The front opening container for large diameter semiconductor wafers of claim 7 wherein the plurality of horizontally extending tabs includes a plurality of spring catches to releasably lock the pair of backstops to the two side wafer supports.

9. The front opening container for large diameter semiconductor wafers of claim 7 wherein the pair of wafer backstops is formed of a material different than that of the two side wafer supports.

10. The front opening container for large diameter semiconductor wafers of claim 7 wherein the pair of wafer backstops each have a plurality of upright wafer engagement surfaces aligned with and transverse to a plurality of top surfaces of the plurality of shelves and the wafer engagement surfaces are positioned to center the wafers on the plurality of wafer shelves for robotic pickup.

11. A front opening container for containing a plurality of large diameter semiconductor wafers, the container comprising:

an enclosure portion having an open interior and comprising a top wall adapted to receive a robotic flange, a bottom wall with a kinematic coupling disposed thereon, a left side wall and a right side wall, a back wall, a door frame opposite the back wall, the door frame defining a front opening, and two side wafer supports positioned in the enclosure portion, one associated with the left side wall and one associated with the right side wall; each side wafer support comprising a plurality of spaced vertically aligned wafer shelves defining slots for the large diameter semiconductor wafers, each side wafer support having a forward portion and a rearward portion;

a pair of wafer backstops removably attached to the rearward end of each of the two side wafer supports, each wafer backstop having a plurality of vertically aligned wafer engagement surfaces corresponding to each of the plurality of wafer shelves and defining the backside of the wafer slots; and a door with a latch mechanism, configured to sealingly close the front opening, the door comprising a wafer cushion for engaging the plurality of large diameter wafers;

wherein each of the pair of wafer backstops engage the respective wafer support at a plurality of vertically aligned stop surfaces of the wafer support that are each in substantial radial alignment with a respective wafer engagement surface of the respective wafer backstop.

12. The front opening container for large diameter semiconductor wafers of claim 11 in combination with a plurality of 450 mm wafers in the plurality of slots.

* * * * *